(12) United States Patent
Huang et al.

(10) Patent No.: US 11,830,862 B2
(45) Date of Patent: Nov. 28, 2023

(54) CHIP STRUCTURE OF MICRO LIGHT-EMITTING DIODE DISPLAY

(71) Applicant: EXCELLENCE OPTO. INC., Miaoli County (TW)

(72) Inventors: Kuo-Hsin Huang, Miaoli County (TW); Yung-Hsiang Chao, Miaoli County (TW); Wen-Hsing Huang, Miaoli County (TW); Chang-Ching Huang, Miaoli County (TW); Tai-Hui Liu, New Taipei (TW)

(73) Assignee: EXCELLENCE OPTO. INC., Hsinchu Science Park (TW)

( * ) Notice: Subject to any disclaimer, the term of this patent is extended or adjusted under 35 U.S.C. 154(b) by 276 days.

(21) Appl. No.: 17/096,686

(22) Filed: Nov. 12, 2020

(65) Prior Publication Data
US 2022/0149023 A1    May 12, 2022

(51) Int. Cl.
*H01L 33/62* (2010.01)
*G09G 3/32* (2016.01)
*H01L 25/16* (2023.01)
*H01L 27/02* (2006.01)

(52) U.S. Cl.
CPC ........... *H01L 25/167* (2013.01); *G09G 3/32* (2013.01); *H01L 27/0255* (2013.01);
(Continued)

(58) Field of Classification Search
CPC ....... G09G 3/32–3291; G09G 2300/02; G09G 2300/04; G09G 2300/0404; G09G 2300/0417; G09G 2300/0421; G09G 2300/0426; G09G 2300/0439; G09G 2300/06–0804; G09G 2300/08; G09G 2300/089; G09G 2310/0264–0275; G09G 2310/06; G09G 2310/08;
(Continued)

(56) References Cited

U.S. PATENT DOCUMENTS

| 5,519,242 A * | 5/1996 | Avery | H01L 27/0255 |
| | | | 257/362 |
| 7,903,052 B2 * | 3/2011 | Kwak | G09G 3/3233 |
| | | | 345/82 |

(Continued)

FOREIGN PATENT DOCUMENTS

WO    WO-2017112674 A1 *    6/2017    ............. H01L 23/29

*Primary Examiner* — Nathan Danielsen
(74) *Attorney, Agent, or Firm* — MUNCY, GEISSLER, OLDS & LOWE, P.C.

(57) ABSTRACT

The invention provides a chip structure of a micro light-emitting diode display, comprising a package substrate, at least one light-emitting diode (LED) element, at least one metal oxide semiconductor field effect transistor (MOSFET), and a connection line. The LED element and the MOSFET are positioned on the package substrate, and each MOSFET comprises a source connected with the input voltage in common, a gate connected with a main control circuit, and a drain. An end of the LED element is connected with the drain of the MOSFET through the connection line, and the other end of the LED element is independently connected with a source drive circuit. Therefore, the MOSFET is provided on the package substrate and integrated in a chip structure, so as to achieve a better heat dissipation effect and requirements of high density and brightness.

8 Claims, 10 Drawing Sheets

(52) U.S. Cl.
CPC ..... *H01L 33/62* (2013.01); *G09G 2300/0426* (2013.01); *G09G 2300/0439* (2013.01); *G09G 2320/041* (2013.01); *G09G 2330/045* (2013.01)

(58) Field of Classification Search
CPC ....... G09G 2320/0233; G09G 2320/04; G09G 2320/041; G09G 2330/04; G09G 2330/045; H01L 25/16; H01L 25/167; H01L 27/0255; H01L 33/62
See application file for complete search history.

(56) References Cited

U.S. PATENT DOCUMENTS

| | | | |
|---|---|---|---|
| 9,468,050 B1* | 10/2016 | Rotzoll | G09G 3/3275 |
| 9,825,016 B1* | 11/2017 | Kim | H01L 27/124 |
| 10,062,675 B2 | 8/2018 | Chang | |
| 10,522,723 B1* | 12/2019 | Huang | H01L 25/0753 |
| 2002/0130786 A1* | 9/2002 | Weindorf | G09G 3/342 |
| | | | 340/815.45 |
| 2007/0295975 A1* | 12/2007 | Omae | H05B 45/40 |
| | | | 257/89 |
| 2010/0237356 A1* | 9/2010 | Haney | H01L 27/0255 |
| | | | 257/481 |
| 2015/0138050 A1* | 5/2015 | Kim | H04N 13/341 |
| | | | 345/76 |
| 2016/0035905 A1* | 2/2016 | Yoo | H01L 29/66106 |
| | | | 257/499 |
| 2016/0148988 A1* | 5/2016 | Cho | G09G 3/3233 |
| | | | 257/40 |
| 2020/0005714 A1* | 1/2020 | Wu | G09G 3/3233 |

* cited by examiner

CHIP STRUCTURE OF MICRO LIGHT-EMITTING DIODE DISPLAY

FIELD OF THE INVENTION

The invention relates to a micro light-emitting diode display, in particular to a chip structure of the micro light-emitting diode display.

BACKGROUND OF THE INVENTION

A micro light-emitting diode (Micro LED) display is revealed in such as U.S. Publication No. U.S. Pat. No. 10,062,675 B2. Each micro light-emitting diode is a single individual and can be regarded as an independent light-emitting module. Due to the self light-emitting display characteristic, the micro light-emitting diode is quite simple in structure without backlight element, owns the characteristics of low energy consumption and high brightness to solve the problems of power consumption and brightness of the current display, and has a great development prospect.

Figure 1:
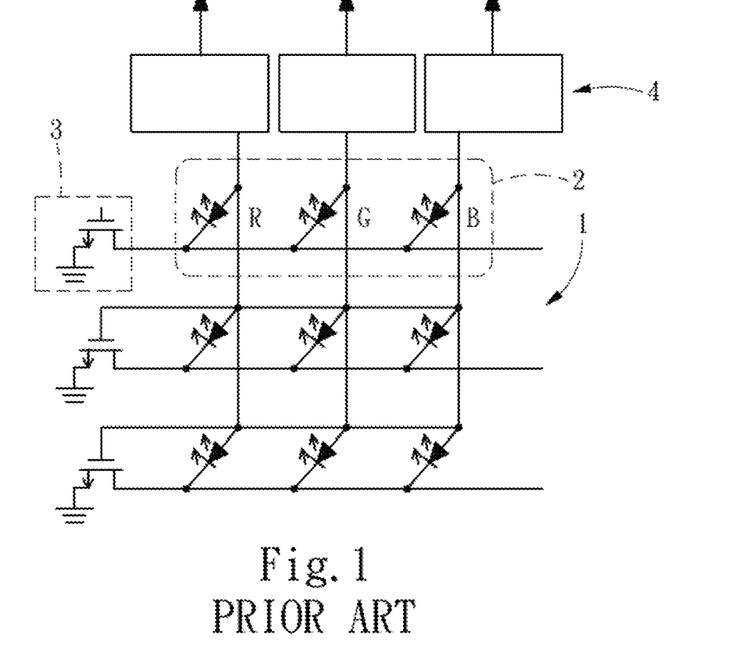
FIG. 1 is a schematic circuit diagram of a conventional common cathode drive mode.
Figure 2:
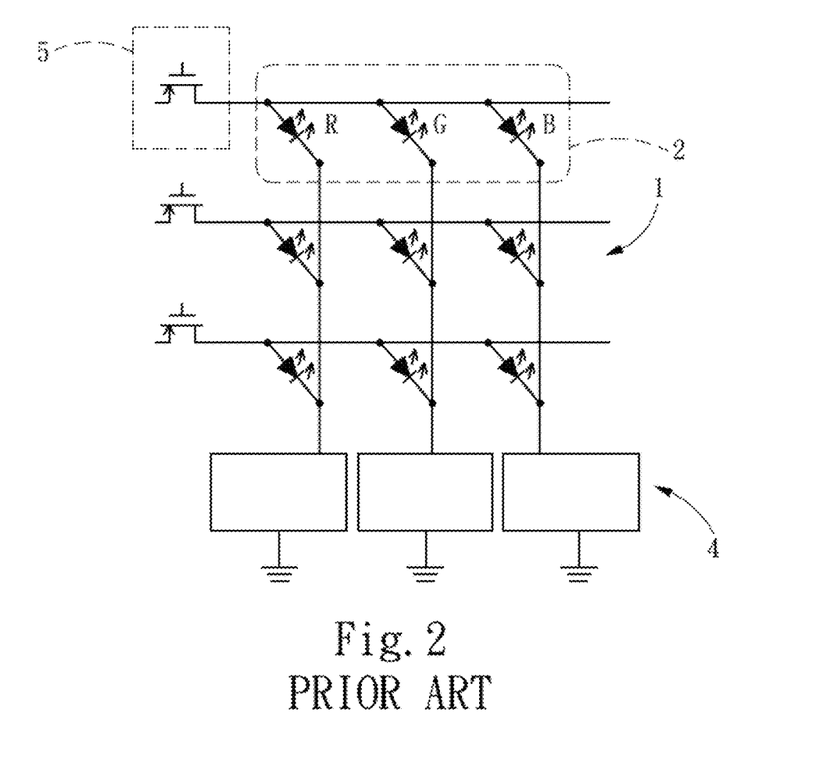
FIG. 2 is a schematic circuit diagram of a conventional common anode drive mode.

Referring to FIG. 1 and FIG. 2, the drive circuit of the micro light-emitting diode display can be roughly divided into a common cathode drive (as shown in FIG. 1) and a common anode drive (as shown in FIG. 2). In the common cathode drive mode as shown in FIG. 1, after the micro light-emitting diode is formed into a light-emitting diode array 1 (LED array), light-emitting diodes of adjacent positions and different colors serve as a same pixel 2, wherein each pixel usually comprises three light-emitting diodes of Red, Green, and Blue. The light-emitting diodes of the same pixel 2 are connected to an N-channel MOSFET (NMOS) 3 in common, wherein the N-channel MOSFET 3 controls whether current passes or not. The light-emitting diodes of the same pixel 2 are controlled by different source drive integrated circuits (ICs) 4 to control the passing current (electron flow) of the light-emitting diodes with different colors to control the light emitting brightness thereof, so that the pixels can be displayed in a full-color mode by a light mixing mode. In the common anode drive mode as shown in FIG. 2, the light-emitting diodes of one pixel 2 is connected to a P-channel MOSFET (PMOS) 5 in common, wherein the P-channel MOSFET 5 controls whether current passes or not. The light-emitting diodes with different colors are also controlled by different source drive ICs 4 to control the passing current (electron flow) of the light-emitting diodes with different colors.

According to the drive structure as described above, the N-channel MOSFET 3 or the P-channel MOSFET 5 for controlling whether current passes or not is integrated into a gate drive IC which is an integrated circuit. If the micro light-emitting diode has requirements of high density and brightness, the gate drive IC needs to carry high current, that is, the gate drive IC needs a large chip size. Therefore, the number of gate channels of the gate drive IC cannot be too large, otherwise there is a problem of heat dissipation and yield, which results in high cost due to the need for a plurality of the gate drive ICs.

SUMMARY OF THE INVENTION

The main purpose of the present invention is to provide a chip structure suitable for a high density and brightness micro light-emitting diode.

The invention provides a chip structure of a micro light-emitting diode display, connecting an input voltage, a main control circuit and a source drive circuit. The chip structure comprises a package substrate, at least one light-emitting diode (LED) element, at least one metal oxide semiconductor field effect transistor (MOSFET) and a connection line.

The at least one LED element is positioned on the package substrate, and the at least one MOSFET is positioned on the package substrate. Each MOSFET comprises a source, a gate and a drain, wherein at least one source of the at least one MOSFET is connected with the input voltage in a common, and the gate of each of the at least one MOSFET is connected with the main control circuit. An end of the at least one LED element is connected with the at least one drain of the at least one MOSFET via the connection line, and another end of the at least one LED element is independently connected with the source drive circuit.

Accordingly, the MOSFET is integrated in the chip structure, and the switch of the MOSFET is controlled by the main control circuit, so that the cost of the gate drive IC can be saved. In addition, the traditional integrated MOSFET circuit is dispersed in each chip, the MOSFET in each chip only needs to carry the current required by the light-emitting diode element in a single chip. Namely, the current carried by the MOSFET in each chip is relatively small, and heat can be dissipated through the packaging plate, so that the heat dissipation is improved, and the requirements of high density and brightness of the micro light-emitting diode can be met.

DETAILED DESCRIPTION OF THE PREFERRED EMBODIMENTS

In order to make the above and other objects, features and advantages of the present invention more comprehensible, a preferred embodiment thereof will now be described below with reference to the accompanying drawings hereafter.

Figure 3:
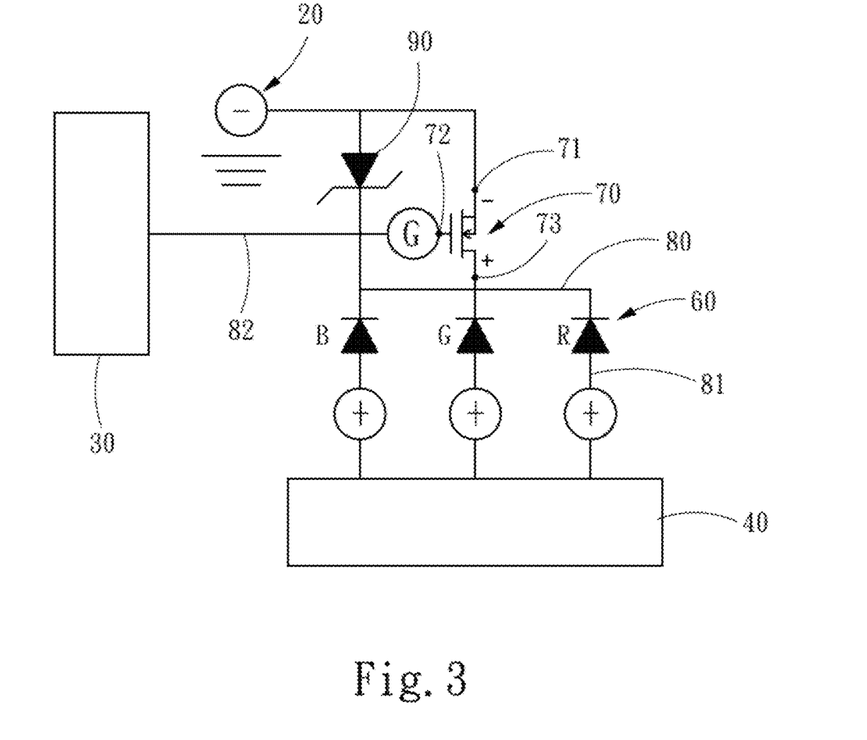
FIG. 3 is a schematic diagram of a chip structure circuit of the present invention.
Figure 4A:
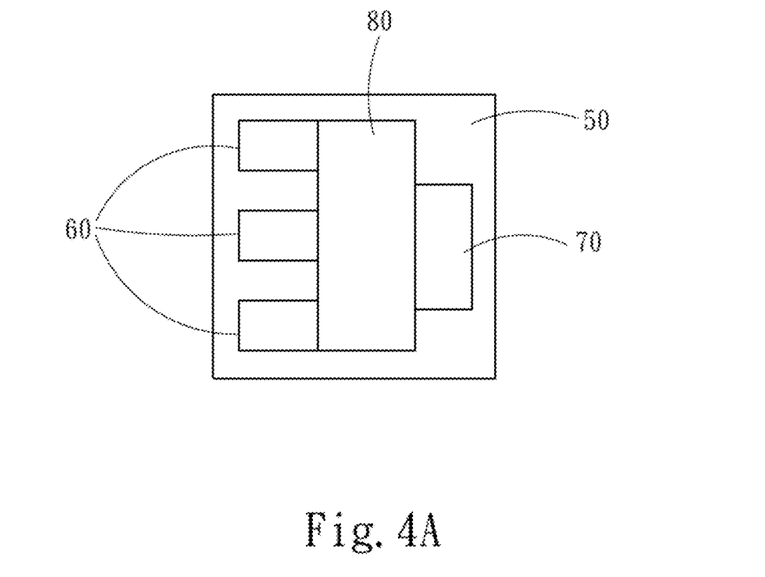
FIG. 4A is a schematic top view of the chip structure of the present invention.
Figure 4B:
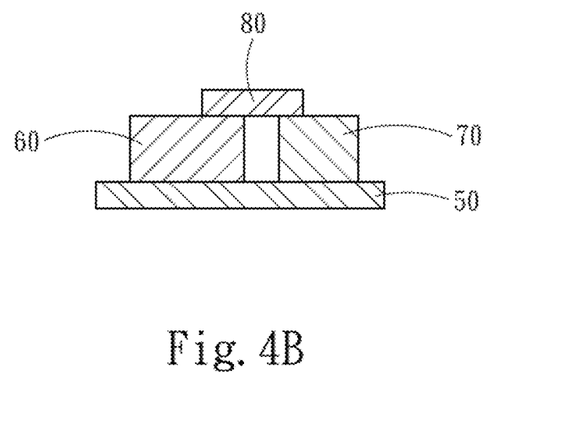
FIG. 4B is a schematic side view of the chip structure of the present invention.

Referring to FIG. 3, FIG. 4A and FIG. 4B, the present invention is a micro light-emitting diode display chip structure which connects with an input voltage 20, a main control circuit 30 and a source drive circuit 40, and the micro light-emitting diode display chip structure comprises a package substrate 50, at least one light-emitting diode (LED) element 60, at least one metal oxide semiconductor field effect transistor (MOSFET) 70 and a connection line 80. As shown in FIG. 3, in an embodiment, a number of the at least one MOSFET 70 is one, and a number of the at least one LED element 60 is three that are respectively illustrated as a red (R) diode, a green (G) diode, and a blue (B) diode. In actual implementation, the at least one LED element 60 may be a single or mono color or particular colors, depending on the requirements.

Further, the at least one LED element 60 is located on the package substrate 50, and the at least one MOSFET 70 is located on the package substrate 50, wherein each MOSFET 70 includes a source 71, a gate 72, and a drain 73. At least one source 71 of the at least one MOSFET 70 is connected with the input voltage 20 in common, and at least one gate 72 of the at least one MOSFET 70 is connected to the main control circuit 30 in common. One end of the at least one LED element 60 is connected to at least one drain 73 of the at least one MOSFET 70 by the connection line 80, and the other end of the at least one LED element 60 is independently connected to the source drive circuit 40. In actual implementation, the at least one LED element 60 is connected to the source drive circuit 40 by a first connection wire 81, and the at least one gate 72 is connected with the main control circuit 30 by a second connection wire 82.

As shown in FIG. 4A and FIG. 4B, in an embodiment, the at least one LED element 60 and the at least one MOSFET 70 are connected to the package substrate 50 by a flip chip bonding process, and the connection line 80 is formed by a copper plating process. More specifically, the connection line 80 is formed by the copper plating process instead of a conventional wire bonding process for rapid mass production. Further, contacts and lines required for connecting the input voltage 20, the main control circuit 30 and the source drive circuit 40 are provided on the package substrate 50 by a packaging process, which is not described in detail herein. Referring to a circuit structure as shown in FIG. 3, in each MOSFET 70, an electrostatic protection diode 90 is connected between the gate 72 and the source 71 so as to protect the at least one LED element 60 from electrostatic damage, and reduce the influence of parasitic capacitance to improve picture quality, thereby brightness and power consumption speed can be optimized, and power utilization efficiency can be improved.

Figure 5:
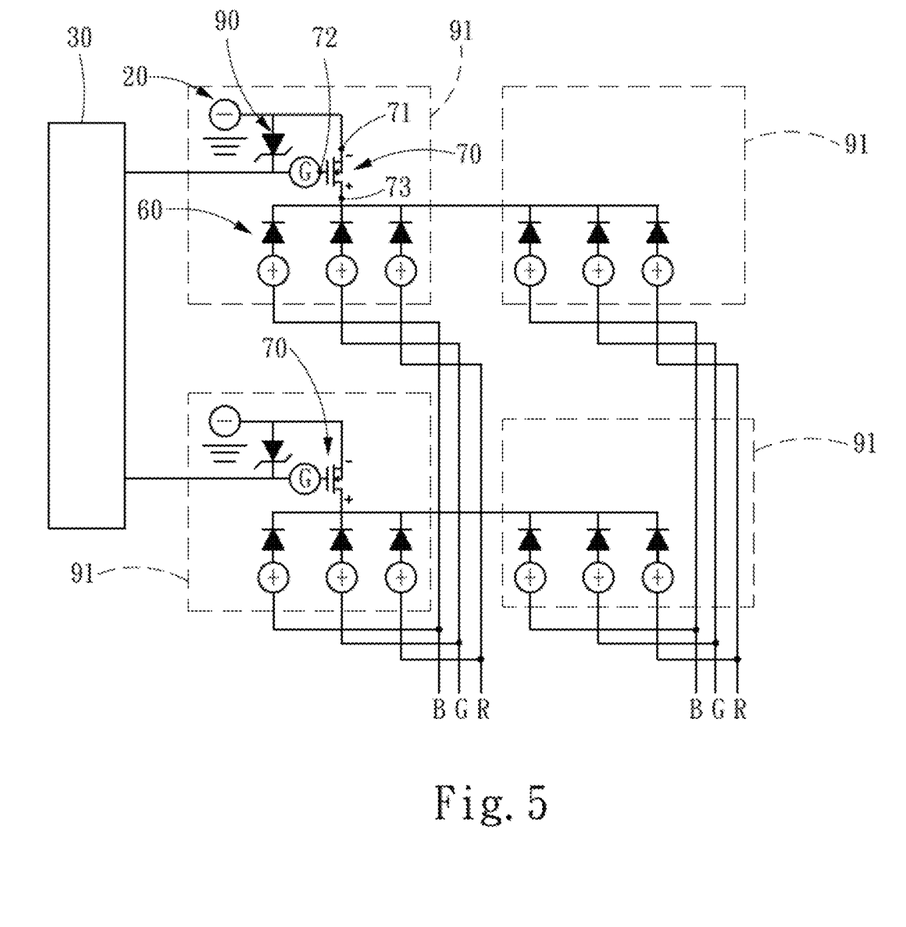
FIG. 5 is a schematic circuit diagram of another chip structure of the present invention.

Referring to FIG. 5, it is a schematic circuit diagram of another chip structure of the present invention. A plurality of pixels 91 are formed by a plurality of LED elements 60 with different colors and grouping. The plurality of pixels 91 are arranged in an A×B matrix (shown as a 2×2 matrix in FIG. 5), and a number of a plurality of MOSFETs 70 is "A". The plurality of LED elements 60 located at the same column is connected to a drain 73 of one of the plurality of MOSFETs 70. That is, the plurality of LED elements 60 in the same column is connected to one MOSFET 70, thereby saving the costs. In other embodiments, it can be modified by changing the circuit wiring design to realize different designs that the plurality of LED elements 60 in the same row are connected to one MOSFET 70, or that the plurality of LED elements 60 arranged in a particular number of matrix, such as the plurality of LED elements 60 in a 2×2 matrix or a 3×3 matrix, connected to one MOSFET 70. In addition, an electrostatic protection diode 90 is connected between a gate 72 and a source 71 in each of the plurality of MOSFETs 70, thereby reducing the influence of parasitic capacitance.

Several possible embodiments of the present invention are set forth below, which are only partial implementations of the present invention and not limited to the embodiments of the present invention.

Figure 6:
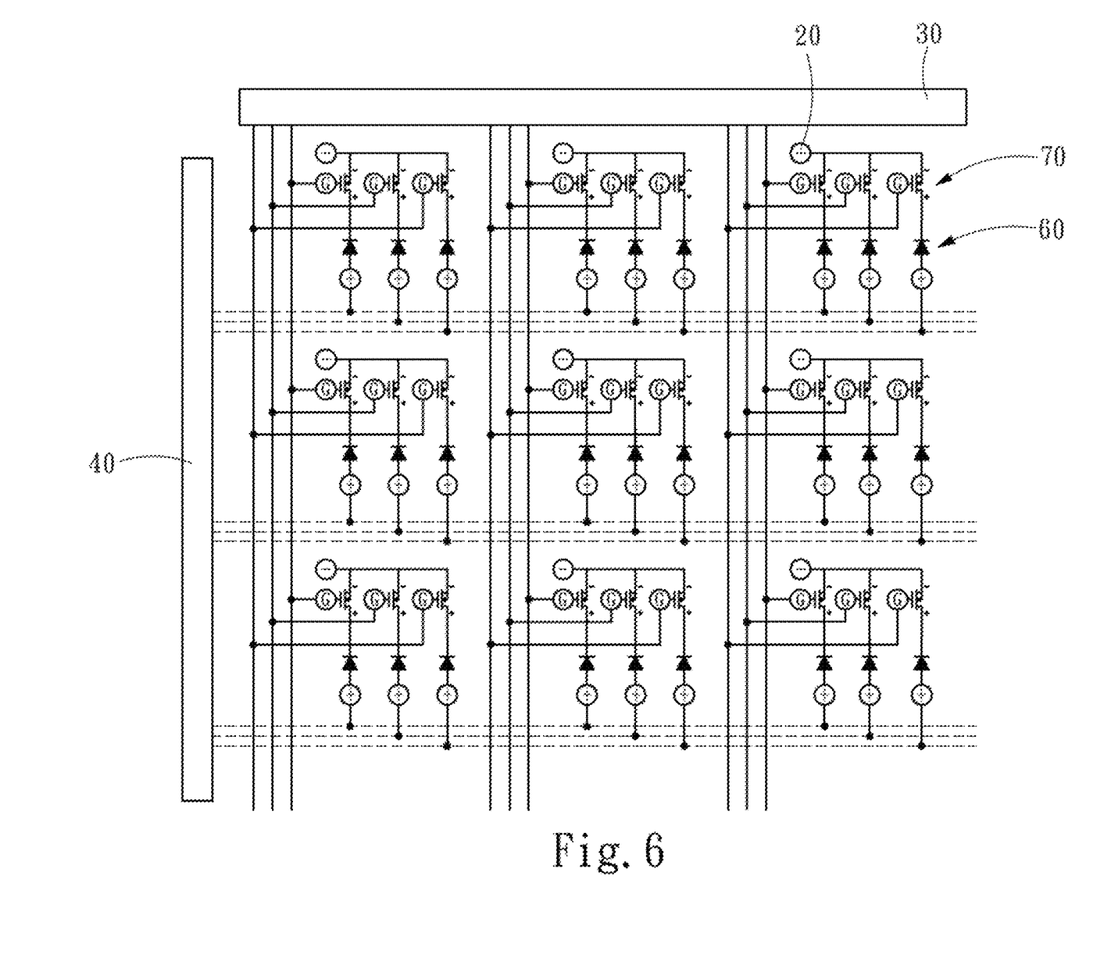
FIG. 6 is a schematic circuit diagram of a first embodiment of the present invention.

Referring to FIG. 6, it is a schematic circuit diagram of a first embodiment of the present invention which is in a common cathode drive manner. A plurality of pixels is formed by a plurality of LED elements 60 with different colors and grouping, the plurality of pixels are arranged in a matrix. A plurality of MOSFETs 70 is N-channel MOSFETs, and the number of the plurality of MOSFETs 70 is the same as that of the plurality of LED elements 60 for connection in a one-to-one manner.

Figure 7:
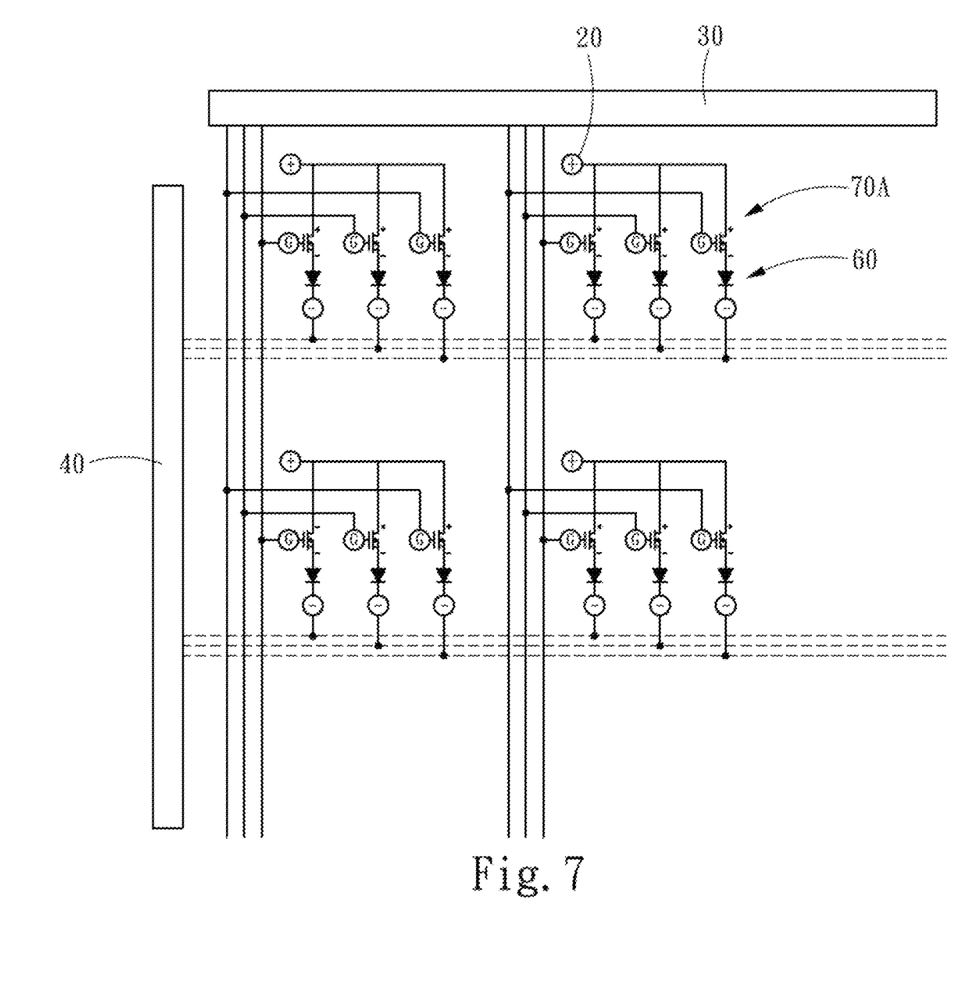
FIG. 7 is a schematic circuit diagram of a second embodiment of the present invention.

Referring to FIG. 7, it is a schematic circuit diagram of a second embodiment of the present invention which is similar to the first embodiment, but in a common anode drive manner. A plurality of pixels is formed by a plurality of LED elements 60 with different colors and grouping, and the plurality of pixels are arranged in a matrix. A plurality of MOSFETs 70A is P-channel MOSFETs, and the number of the MOSFET 70A is the same as the plurality of LED elements 60 for connection in a one-to-one manner.

Figure 8:
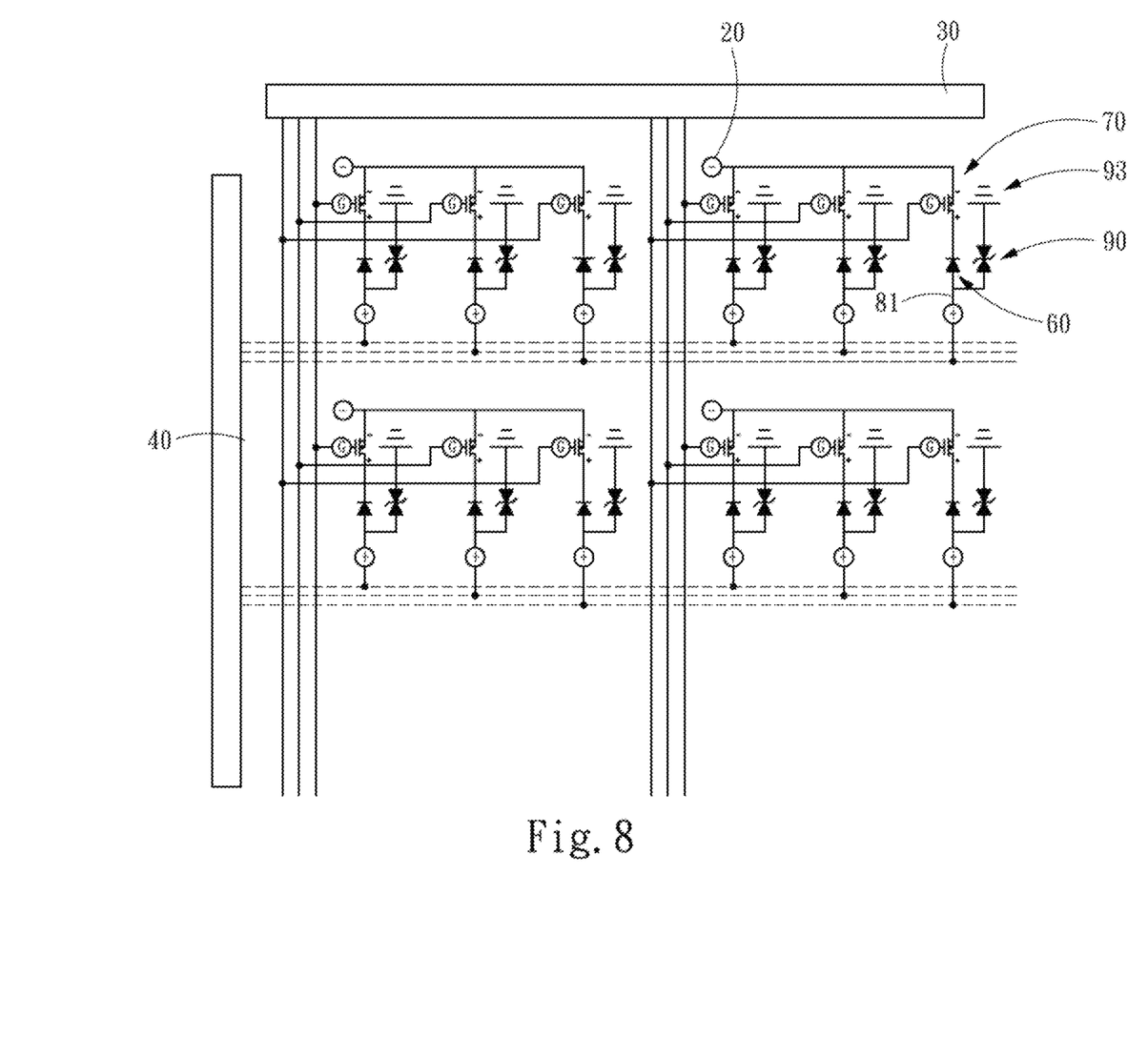
FIG. 8 is a schematic circuit diagram of a third embodiment of the present invention.

Referring to FIG. 8, it is a schematic circuit diagram of a third embodiment of the present invention. This embodiment is based on the common cathode drive of the first embodiment plus electrostatic discharge (ESD) protection. In this embodiment, an electrostatic protection diode 90 is connected between a first connection wire 81 and a ground terminal 93.

Figure 9:
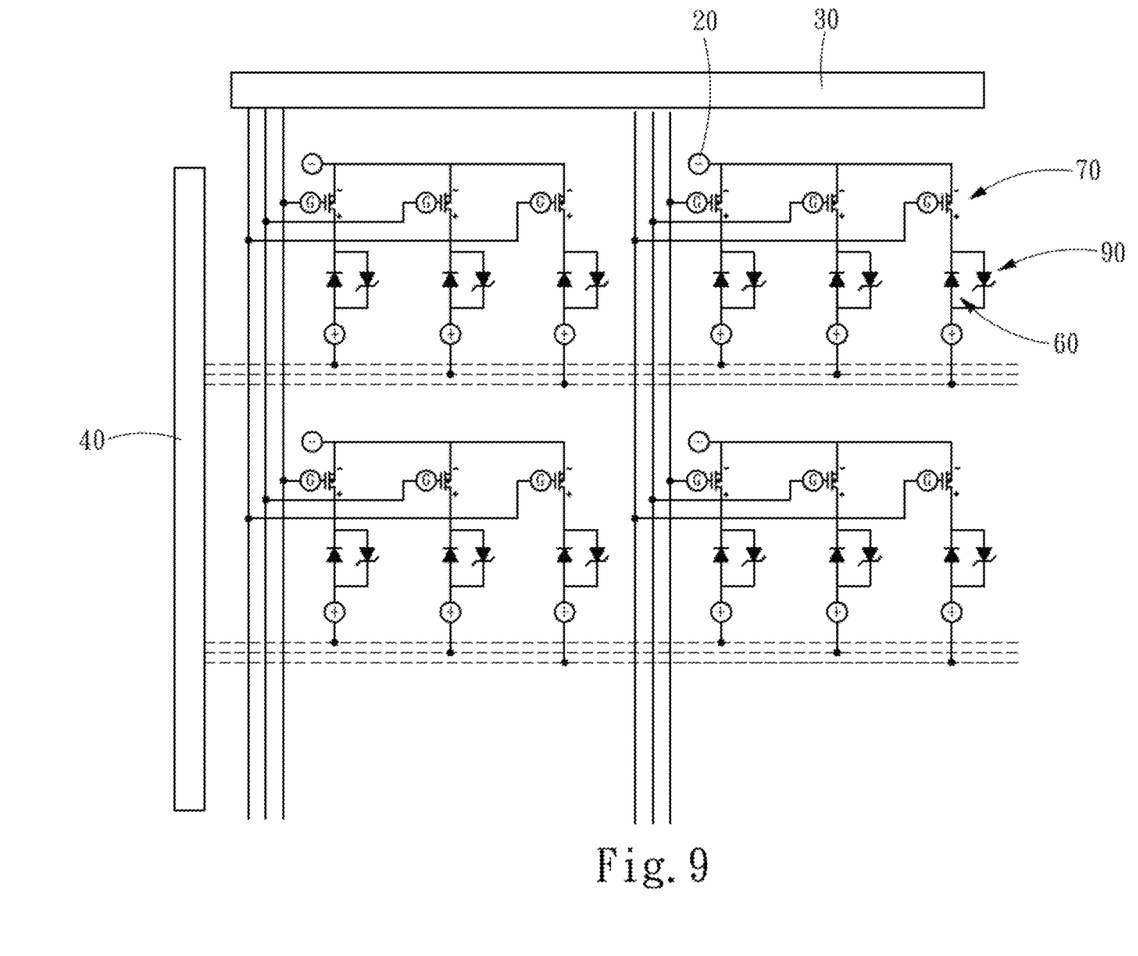
FIG. 9 is a schematic circuit diagram of a fourth embodiment of the present invention.

Referring to FIG. 9, it is a schematic circuit diagram of a fourth embodiment of the present invention. This embodiment is based on the common cathode drive mode of the first embodiment plus electrostatic discharge (ESD) protection. In this embodiment, each of a plurality of LED elements 60 is connected in parallel with an electrostatic protection diode 90.

Figure 10:
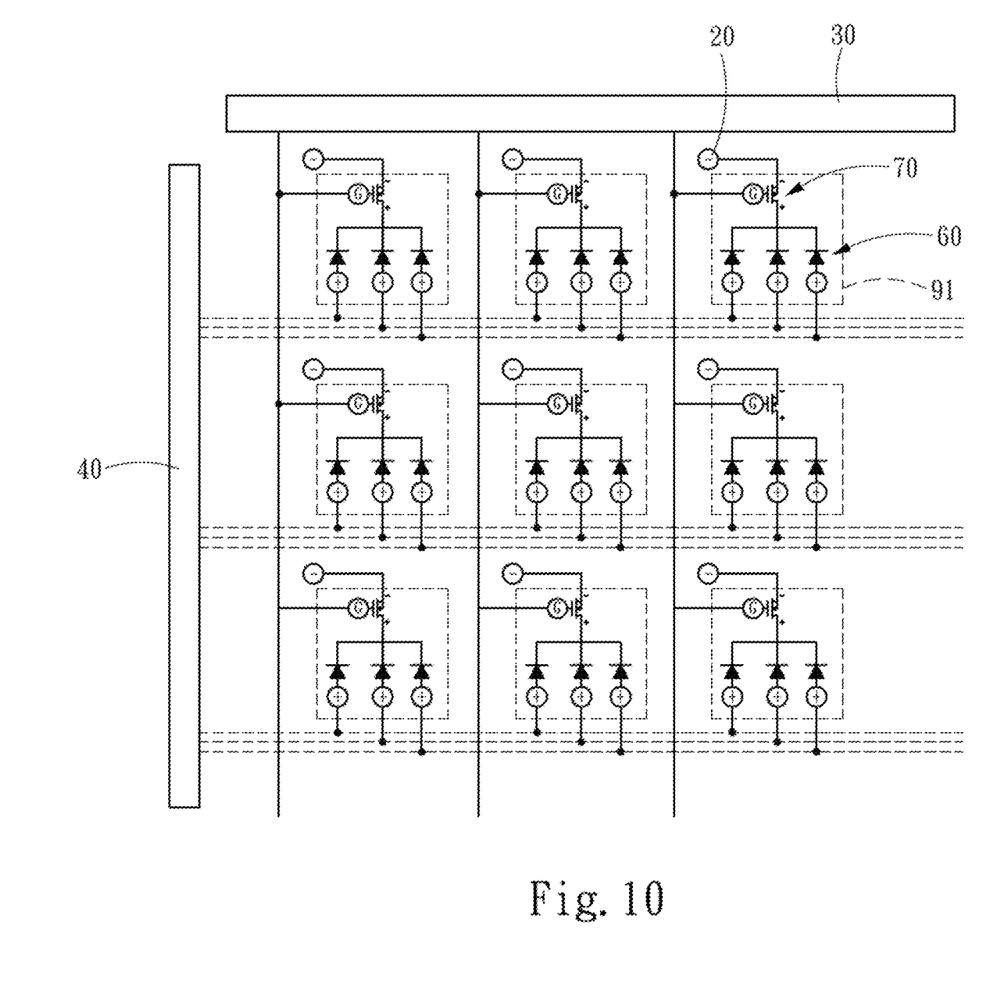
FIG. 10 is a schematic circuit diagram of a fifth embodiment of the present invention.

Referring to FIG. 10, it is a schematic circuit diagram of a fifth embodiment of the present invention. The common cathode drive mode is adopted in the embodiment. A plurality of pixels 91 are formed by a plurality of LED elements 60 with different colors and grouping, and the plurality of pixels 91 are arranged in a matrix. The number of a plurality of MOSFETs 70 is the same as that of the plurality of pixels 91, and the plurality of LED elements 60 in one of the plurality of pixels 91 is connected to one of the plurality of MOSFET 70 which corresponds to the pixel 91.

Figure 11:
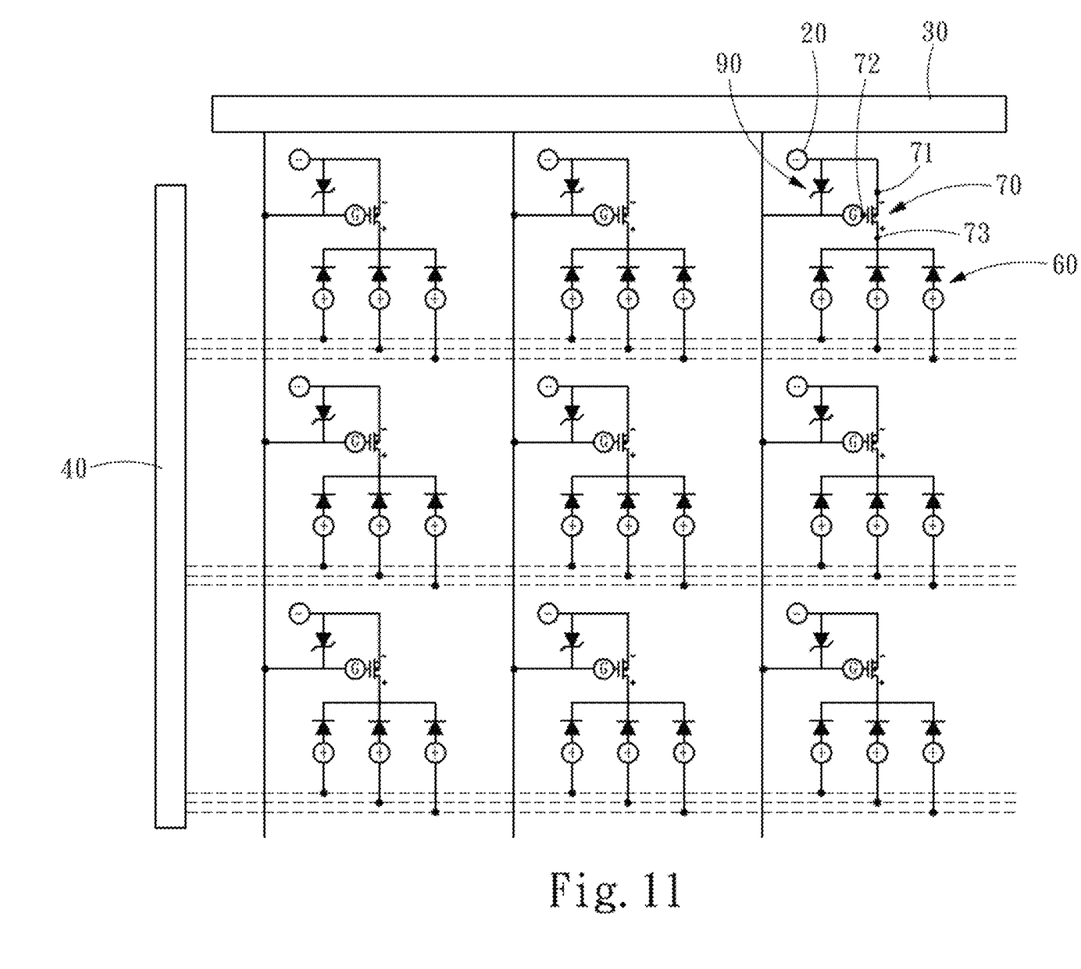
FIG. 11 is a schematic circuit diagram of a sixth embodiment of the present invention.

Referring to FIG. 11, it is a schematic circuit diagram of a sixth embodiment of the present invention. This embodiment is based on the common cathode drive mode of the fifth embodiment plus electrostatic discharge (ESD) protection. In this embodiment, an electrostatic protection diode 90 is connected between a gate 72 and a source 71 of each of a plurality of MOSFETs 70.

Figure 12:
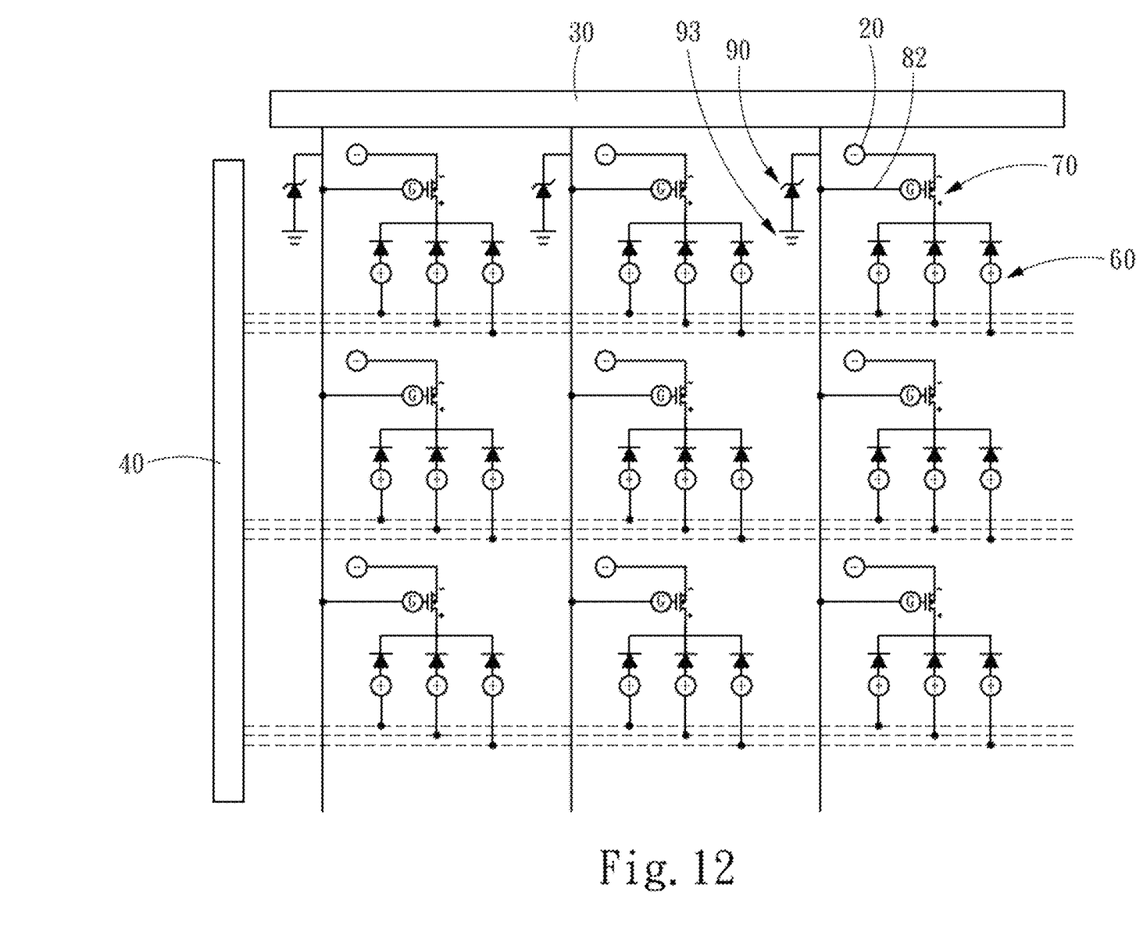
FIG. 12 is a schematic circuit diagram of a seventh embodiment of the present invention.

Referring to FIG. 12, it is a schematic circuit diagram of a seventh embodiment of the present invention. This embodiment is based on the common cathode drive mode of the fifth embodiment plus electrostatic discharge (ESD) protection. In this embodiment, an electrostatic protection diode 90 is connected between a second connection wire 82 and a ground terminal 93.

In summary, the invention includes at least the following characteristics.

1. The at least one MOSFET is allowed to be arranged on the package substrate and dispersed in each chip structure. The at least one MOSFET in each chip only needs to carry the current required by the light-emitting diode element in a single chip. Namely, the current carried by the at least one MOSFET in each chip is relatively small, and heat can be dissipated through the package substrate, so that the heat dissipation is good, and the use requirements of high density (Dot pitch <0.5 mm) and brightness (>1000 nits) of the micro light-emitting diode can be met.
2. By integrating the electrostatic protection diode in the chip structure, the influence of parasitic capacitance can be reduced, the picture quality can be improved, the brightness and the power consumption speed can be optimized, and the efficiency of power can be improved.
3. The switch of the gate can be controlled by the main control circuit instead of a traditional gate drive IC, so that the cost is saved.
4. The copper plating process is used to reduce the cost and accelerates the production speed, and wire bonding or copper column elements are not needed.

What is claimed is:

1. A chip structure of a micro light-emitting diode display, connecting with an input voltage, a main control circuit and a source drive circuit, and comprising:
   a package substrate;
   at least one light-emitting diode (LED) element, directly positioned on the package substrate;
   one metal oxide semiconductor field effect transistor (MOSFET), directly positioned on the package substrate, wherein the MOSFET comprises a source, a gate connected with the main control circuit, and a drain, and the source of the MOSFET is connected with the input voltage; and
   a connection line, positioned on the at least one LED element and the MOSFET, connecting an end of the at least one LED element and the drain of the MOSFET, and being formed by a copper plating process, wherein another end of the at least one LED element is independently connected with the source drive circuit.

2. The chip structure according to claim 1, wherein an electrostatic protection diode is connected between the gate and the source.

3. The chip structure according to claim 1, wherein a number of the at least one LED element is three that are respectively a red diode, a green diode and a blue diode.

4. The chip structure according to claim 3, wherein an electrostatic protection diode is connected between the gate and the source.

5. The chip structure according to claim 1, wherein the at least one LED element and the MOSFET are connected to the package substrate by a flip chip bonding process, and the connection line is formed by a copper plating process.

6. The chip structure according to claim 1, wherein the chip structure comprises a plurality of LED elements with different colors, and the plurality of LED elements is grouped to form a plurality of pixels arranged in a matrix, and a number of the MOSFET is the same as the number of the plurality of pixels, and the plurality of LED elements in one of the plurality of pixels is connected to one of the MOSFET which corresponds to the one of the plurality of pixels.

7. The chip structure according to claim 6, wherein an electrostatic protection diode is connected between the gate and the source of the MOSFET.

8. The chip structure according to claim 6, wherein the gate of the MOSFET is connected with the main control circuit by a second connection wire, and an electrostatic protection diode is connected between the second connection wire and a ground terminal.

* * * * *